United States Patent
Kelkar et al.

(10) Patent No.: US 9,000,587 B1
(45) Date of Patent: Apr. 7, 2015

(54) WAFER-LEVEL THIN CHIP INTEGRATION

(71) Applicant: Maxim Integrated Products, Inc., San Jose, CA (US)

(72) Inventors: Amit S. Kelkar, Flower Mound, TX (US); Vivek S. Sridharan, Addison, TX (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 13/930,439

(22) Filed: Jun. 28, 2013

Related U.S. Application Data

(60) Provisional application No. 61/777,031, filed on Mar. 12, 2013.

(51) Int. Cl.
*H01L 23/498* (2006.01)
*H01L 21/60* (2006.01)
*H01L 25/00* (2006.01)

(52) U.S. Cl.
CPC ............... *H01L 25/50* (2013.01); *H01L 25/00* (2013.01)

(58) Field of Classification Search
USPC ......... 257/737, 738, 778, 774, 773, 668, 698, 257/659, 700, 734, 770, 787, E23.026, 257/E23.001, E23.125, E23.178
See application file for complete search history.

(56) References Cited

U.S. PATENT DOCUMENTS

| | | | | |
|---|---|---|---|---|
| 6,683,379 B2 * | 1/2004 | Haji et al. | | 257/729 |
| 6,847,066 B2 * | 1/2005 | Tahara et al. | | 257/243 |
| 7,417,311 B2 * | 8/2008 | Yamano | | 257/707 |
| 7,468,292 B2 * | 12/2008 | Yamano | | 438/113 |
| 7,547,975 B2 * | 6/2009 | Takaya et al. | | 257/778 |
| 7,808,073 B2 * | 10/2010 | Wakisaka | | 257/528 |
| 7,999,401 B2 * | 8/2011 | Murai et al. | | 257/797 |
| 8,164,171 B2 * | 4/2012 | Lin et al. | | 257/686 |
| 8,293,579 B2 * | 10/2012 | Sakamoto et al. | | 438/110 |
| 8,330,279 B2 * | 12/2012 | Miki | | 257/779 |
| 8,531,032 B2 * | 9/2013 | Yu et al. | | 257/738 |
| 2005/0112800 A1 * | 5/2005 | Yamano | | 438/113 |
| 2006/0138671 A1 * | 6/2006 | Watanabe | | 257/773 |
| 2007/0296065 A1 * | 12/2007 | Yew et al. | | 257/659 |
| 2008/0009097 A1 * | 1/2008 | Lim | | 438/109 |
| 2008/0213976 A1 * | 9/2008 | Farnworth | | 438/460 |
| 2010/0084759 A1 * | 4/2010 | Shen | | 257/690 |
| 2010/0213599 A1 * | 8/2010 | Watanabe et al. | | 257/693 |
| 2011/0042820 A1 * | 2/2011 | Knickerbocker | | 257/774 |
| 2012/0025362 A1 * | 2/2012 | Chandrasekaran et al. | | 257/680 |
| 2013/0043599 A1 * | 2/2013 | Huang et al. | | 257/774 |
| 2013/0052796 A1 * | 2/2013 | Saito et al. | | 438/455 |
| 2013/0171751 A1 * | 7/2013 | Guu et al. | | 438/15 |

\* cited by examiner

*Primary Examiner* — Alexander Oscar Williams
(74) *Attorney, Agent, or Firm* — Advent, LLP

(57) ABSTRACT

A wafer-level package device and techniques for fabricating the device are described that include embedding a silicon chip onto an active device wafer or a passive device wafer, where the embedded silicon chip is a thin chip (e.g., <50 μm). In implementations, the wafer-level package device that employs the techniques of the present disclosure includes an active device wafer, a thin integrated circuit chip, an encapsulation structure covering at least a portion of the active device wafer and the thin integrated circuit chip, a redistribution layer structure, and at least one solder bump for providing electrical interconnectivity. Once the wafer is singulated into semiconductor devices, each semiconductor device including the embedded thin integrated circuit chip may be mounted to a printed circuit board.

20 Claims, 5 Drawing Sheets

WAFER-LEVEL THIN CHIP INTEGRATION

CROSS-REFERENCE TO RELATED APPLICATIONS

The present application claims the benefit under 35 U.S.C. §119(e) of U.S. Provisional Application Ser. No. 61/777,031, filed Mar. 12, 2013, and titled "WAFER-LEVEL THIN CHIP INTEGRATION." U.S. Provisional Application Ser. No. 61/777,031 is herein incorporated by reference in its entirety.

BACKGROUND

Packaging technologies have evolved to develop smaller, cheaper, more reliable, and more environmentally-friendly packages. For example, chip-scale packaging technologies have been developed that employ direct surface mountable packages having a surface area that is no greater than 1.2 times the area of the integrated circuit chip. Wafer-level packaging (WLP) is a chip-scale packaging technology that encompasses a variety of techniques whereby integrated circuit chips are packaged at wafer level, prior to segmentation. Wafer-level packaging extends the wafer fabrication processes to include device interconnection and device protection processes. Consequently, wafer-level packaging streamlines the manufacturing process by allowing for the integration of wafer fabrication, packaging, testing, and burn-in processes at the wafer level.

Traditional fabrication processes used in the manufacture of semiconductor devices employ microlithography to pattern integrated circuits onto a circular wafer formed of a semiconductor such as silicon, gallium arsenide, and so forth. Typically, the patterned wafers are segmented into individual integrated circuit chips or dies to separate the integrated circuits from one another. The individual integrated circuit chips are assembled or packaged using a variety of packaging technologies to form semiconductor devices that may be mounted to a printed circuit board.

SUMMARY

A device and fabrication techniques are described that employ wafer-level packaging techniques to fabricate semiconductor devices that include an embedded silicon chip onto an active device wafer or a passive wafer (e.g., nonfunctional), where the embedded silicon chip is a thin chip (e.g., <50 μm). The wafer-level package devices provide mechanical protection of the embedded integrated circuit chips (dies) contained within the device packages similar to that provided by other devices while maintaining the benefits inherent in wafer-level packaging (e.g., lower cost, smaller package size, high pin count, etc.). In implementations, the wafer-level package device includes an active device wafer or a passive wafer, a thin integrated circuit chip, an encapsulation structure covering at least a portion of the active device wafer and the thin integrated circuit chip, at least one redistribution layer structure (i.e., in some implementations, multiple redistribution layers are needed), and at least one solder bump for providing mechanical support and electrical interconnectivity to the devices. Once the wafer is singulated into semiconductor devices, the semiconductor devices may be mounted to a printed circuit board, and the solder bumps may provide electrical interconnectivity through the backside of the device that interface with pads of the printed circuit board.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

FIG. 1 is a diagrammatic partial cross-sectional side elevation view illustrating a wafer-level package device in accordance with an example implementation of the present disclosure, wherein the wafer-level package device includes a single device configuration having an active device wafer, a thin integrated circuit chip, an encapsulation structure, a redistribution layer structure, and at least one solder bump.

DETAILED DESCRIPTION

Overview

Figure 1:
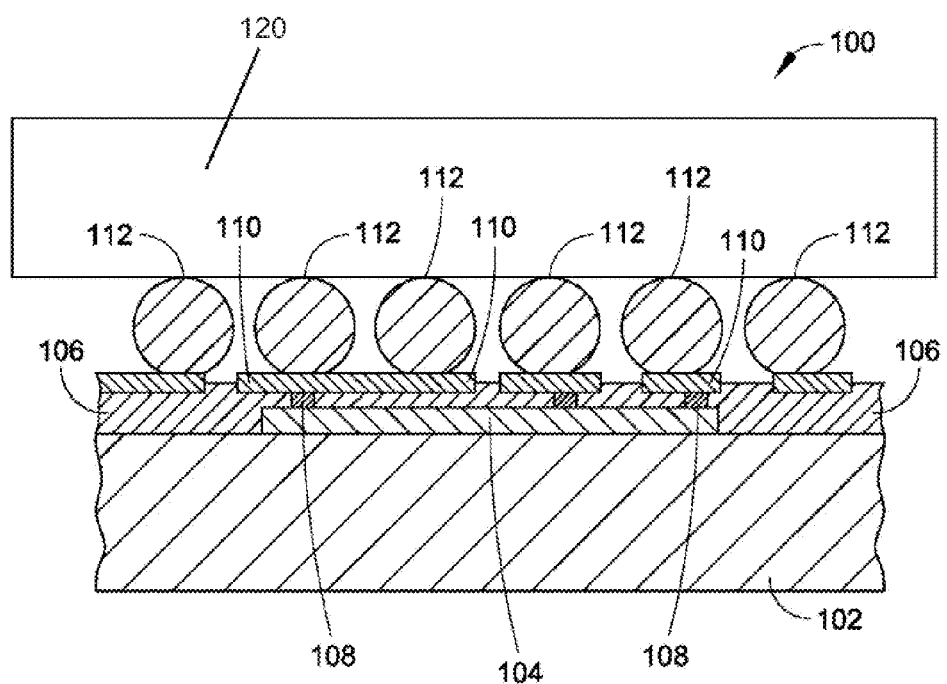

Wafer-level packaging is a chip-scale packaging technology that encompasses a variety of techniques whereby integrated circuit chips are packaged at wafer level, prior to segmentation. Wafer-level packaging extends the wafer fabrication processes to include device interconnection and device protection processes. Consequently, wafer-level packaging streamlines the manufacturing process by allowing for the integration of wafer fabrication, packaging, testing, and burn-in processes at the wafer level. Compared to some packaging techniques (e.g., flat no-lead (QFN)), wafer-level packaging is generally less costly to implement since packaging occurs at wafer level, while flat no-lead packaging is performed at strip level.

As the number of computer applications grow, a greater amount of processing functionality and storage functionality provided by integrated circuitry may be required. However, the greater the number of circuitry required may correlate to a greater amount of physical space required in the multimedia devices. A 3D die can be constructed using two or more layers of electronic components integrated into a single device, often from stacking and processing semiconductor wafers. The electronic components may be stacked to form a single electrical circuit. It is advantageous to embed silicon chips onto an active device wafer for 3D integration and on a carrier silicon wafer for fan out because of simplified fabrication steps and/or increased functionality.

Accordingly, a wafer-level package device and techniques are described that include embedding a silicon chip onto an active device wafer, where the embedded silicon chip is a thin chip (e.g., <50 μm). The wafer-level package devices may thus provide mechanical protection of the embedded integrated circuit chips (dies) contained within the device packages similar to that provided by other devices while maintaining the benefits inherent in wafer-level packaging (e.g., lower cost, smaller package size, high pin count, etc.). In implementations, the wafer-level package device that employs example techniques in accordance with the present disclosure includes an active device wafer or a passive wafer, a thin integrated circuit chip, an encapsulation structure covering at least a portion of the active device wafer and the thin integrated circuit chip, a redistribution layer structure (in some implementations, more than one redistribution layer is used), and at least one solder bump for providing electrical interconnectivity. In implementations, a process for fabricating the wafer-level package device that employs example techniques in accordance with the present disclosure includes placing a thin integrated circuit chip device on a processed active device wafer, forming an encapsulation structure, exposing or face-grinding the encapsulation structure, forming a redistribution layer, and forming at least one solder bump on the redistribution layer. Once the wafer is singulated into individual semiconductor devices, each semiconductor device including the embedded thin integrated circuit chip may be mounted to a printed circuit board.

Example Implementations

FIG. 1 illustrates a wafer level package device 100 in accordance with example implementations of the present disclosure. In implementations, the wafer level package device 100 may include wafer-level integrated circuit package devices. As shown, the wafer level package device 100 includes a wafer 102 including one or more integrated circuits formed therein. The wafer 102 may include as a portion of a semiconductor wafer substrate, such as a silicon wafer (e.g., p-type wafer, n-type wafer, and so forth), a germanium wafer, and so forth, that includes one or more integrated circuits formed therein. The integrated circuits may be formed through suitable front-end-of-line (FEOL) fabrication techniques near the surface of the semiconductor wafer substrate. In various implementations, the integrated circuits may include digital integrated circuits, analog integrated circuits, mixed signal integrated circuits, combinations thereof, and so forth.

As shown in FIG. 1, the wafer level package device 100 further includes a thin integrated circuit chip 104 coupled to the wafer 102. In implementations, the thin integrated circuit chip 104 is approximately equal to or less than 50 μm in thickness. Utilizing a thin integrated circuit chip 104 that is equal to or less than 50 μm allows for greater physical space savings in a 3D IC package while utilizing a fan-out configuration. The thin integrated circuit chip 104 may include one or more integrated circuits formed therein, which may include digital integrated circuits, analog integrated circuits, mixed signal integrated circuits, combinations thereof, etc. Placement of the thin integrated circuit chip 104 may include over and/or on the surface of the wafer 102. Additionally, the thin integrated circuit chip 104 may be positioned over an electrical interconnection structure (e.g., a redistribution layer, a solder ball array, a lead frame, a contact pad, a bonding pad, etc.) disposed on the wafer 102 and may be in electrical communication with the wafer 102, for example, using solder connections, wire leads, through-silicon vias, contact pads, etc. In some implementations, the thin integrated circuit chip 104 may be placed on the wafer 102 using an adhesive. In these implementations, electrical interconnections may include through-silicon vias, contact pads, etc. As shown in FIG. 1, the thin integrated circuit chip 104 may include other electrical connections, such as pillars 108 extending from the thin integrated circuit chip 104 on a side distal from the wafer 102. In an implementation, the pillars 108 are copper pillars fabricated via suitable manufacturing processes, such as a dual lamination/deposition process. The pillars 108 may serve to provide electrical interconnections between the thin integrated circuit chip 104 and another semiconductor device (e.g., the wafer 102, a redistribution layer structure 110, etc.). Thus, the thin integrated circuit chip 104 extends additional functionality to the wafer level package device 100 by enabling system-in-a-package capabilities.

The wafer level package device 100 further includes an encapsulation structure 106 configured to encapsulate at least a portion of the wafer 102 and the thin integrated circuit chip 104. In implementations, the encapsulation structure 106 is configured to provide mechanical and/or environmental protection to the wafer 102, the thin integrated circuit chip 104, and/or a redistribution layer structure 110. In some implementations, the encapsulation structure 106 may include a mold compound (e.g., an overmold), a ceramic material, and/or polymer molding compounds, for example, which may include composite materials including epoxy resins, phenolic hardeners, silicas, catalysts, pigments, and mold release agents, etc. In one implementation, the encapsulation structure 106 includes a dielectric layer, such as polybenzoxazole (PBO), which encapsulates and/or protects at least a portion of the thin integrated circuit chip 104, the wafer 102, and/or the pillars 108. In another implementation, the encapsulation structure 106 includes a layer of epoxy, which encapsulates and/or protects the thin integrated circuit chip 104. Additionally, a portion of the encapsulation structure 106 may be configured to be removed (e.g., during a backgrind or lapping process) to expose pillars 108 or other electrical/mechanical connections that connect to other electrical interconnections (e.g., an RDL structure or solder bump array).

As illustrated in FIG. 1, the wafer level package device 100 includes a redistribution layer structure 110 that is electrically coupled to the thin integrated circuit chip 104. In implementations, a redistribution layer structure 110 includes a redistribution layer including a thin-film metal (e.g., aluminum, copper, polysilicon, etc.) rerouting and interconnection system that redistributes contact pads on the thin integrated circuit chip 102 to an array of bump interfaces that may be evenly deployed over the wafer level package device 100. Additionally, the redistribution layer structure 110 may include other interconnection structures, such as contact pads, pillars 108, under-bump metallization (UBM), metal runs, etc. The redistribution layer structure 110 may be electrically isolated from the wafer 102 and the thin integrated circuit chip 104 by the encapsulation structure 106 or a dielectric or passivation layer, except for connections to, for example, bond pads, the pillars 108, or metal runs. In some implementations, the thin integrated circuit chip 104 may be electrically connected to the wafer 102 or other semiconductor device using other techniques (e.g., through-silicon vias, lead wires, etc.).

The wafer level package device 100 includes at least one solder bump 112 that is electrically and/or mechanically coupled to the redistribution layer structure 110 as shown in FIG. 1. The at least one solder bump 112 may serve to furnish mechanical and/or electrical interconnection between the redistribution layer structure 110 and corresponding contact pads of another semiconductor device (e.g., a printed circuit board, another integrated circuit, etc.). The at least one solder bump 112 may be of various sizes and pitches. In one specific implementation, an array of solder bumps 112 may include solder bumps 112 having a diameter of 50 μm and a pitch of 0.5 mm. It is contemplated that other solder bump 112 diameters and pitches may be suitable for use in the wafer level package device 100. In implementations, the solder bump 112 may be fabricated of a lead-free solder such as a Tin-Silver-Copper (Sn—Ag—Cu) alloy solder (i.e., SAC), a Tin-Silver (Sn—Ag) alloy solder, a Tin-Copper (Sn—Cu) alloy solder, etc. In some implementations, the at least one solder bump 112 may include a fan-out configuration of solder bumps where the solder bumps are arranged in a large array.

Subsequent to forming the redistribution layer structure 106 and the at least one solder bump 112, additional layers may be added to the wafer-level package device 100 beyond the redistribution layer structure 106 and the at least one solder bump 112 (e.g., electrical interconnections, encapsulation layers, dielectric and/or passivation layers, and/or layers configured to function as electrical/mechanical/structural support). Further, the wafer-level package device 100 may be singulated into individual semiconductor devices subsequent to the formation of additional layers and coupled to a printed circuit board 120, thereby forming an electronic device. A printed circuit board 120 may include a circuit board used to mechanically support and electrically connect electronic components (e.g., the individual semiconductor devices) using conductive pathways, tracks or signal traces etched from copper sheets laminated onto a non-conductive substrate.

Example Fabrication Processes

Figure 2:
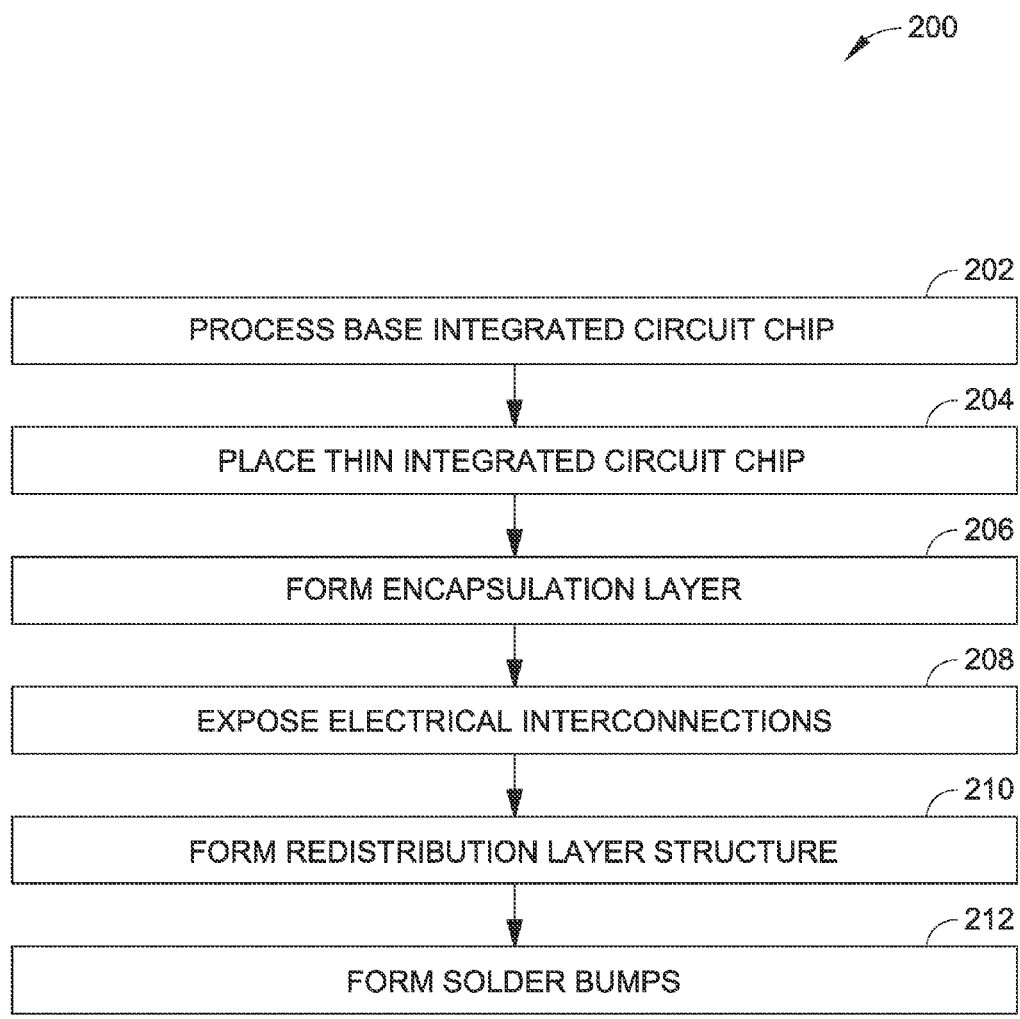
FIG. 2 is a flow diagram illustrating a process in an example implementation for fabricating a wafer-level package device, such as the device shown in FIG. 1.

FIG. 2 illustrates an example process 200 that employs wafer-level packaging techniques to fabricate semiconductor devices including an embedded thin integrated circuit chip 104, such as the wafer level package device 100 shown in FIG. 1. FIGS. 3A through 3F illustrate sections 300 of an example encapsulated thin integrated circuit chip 304 that are utilized to fabricate semiconductor devices (such as wafer level package device 100 shown in FIG. 1).

Figure 3A:
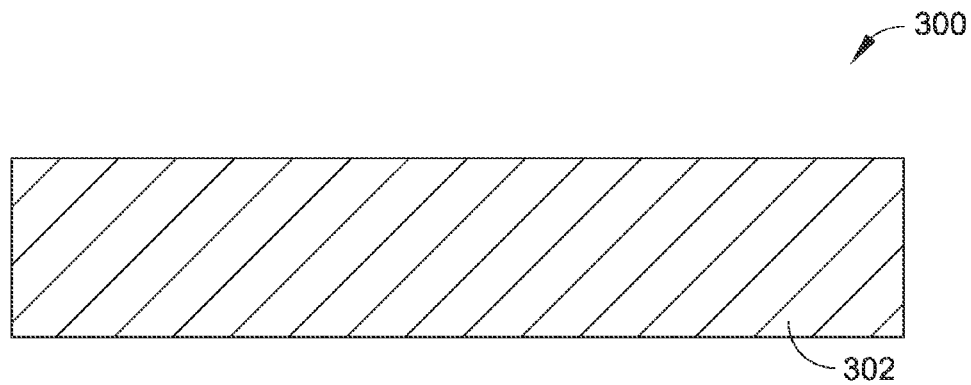
FIG. 3A is a diagrammatic partial cross-sectional side elevation view illustrating the fabrication of a wafer-level package device, such as the device shown in FIG. 1, in accordance with the process shown in FIG. 2.

Accordingly, an active device wafer is processed (Block 202). FIG. 3A illustrates a portion of the wafer 302, which, when processed through suitable front end-of-line (FEOL) fabrication techniques, includes a semiconductor substrate that includes one or more integrated circuits formed therein. The processed integrated circuits may be configured in a variety of ways. For example, processing the integrated circuits may include processing digital integrated circuits, analog integrated circuits, mixed-signal integrated circuits, etc. The processed integrated circuits are connected to one or more conductive layers (e.g., bump interfaces, redistribution layers, etc.) that provide electrical contacts through which the integrated circuits are interconnected to other components associated with the wafer 302, such as printed circuit boards, the thin integrated circuit chip 304, etc. In an implementation, processing a wafer 302 includes processing a silicon wafer configured to receive a pick-and-placed thin integrated circuit chip 304, where the silicon wafer has been processed using FEOL techniques. In some implementations, the wafer may include an active device silicon wafer. in other implementations, the wafer may include a passive (e.g., non-functional) silicon wafer.

Figure 3B:
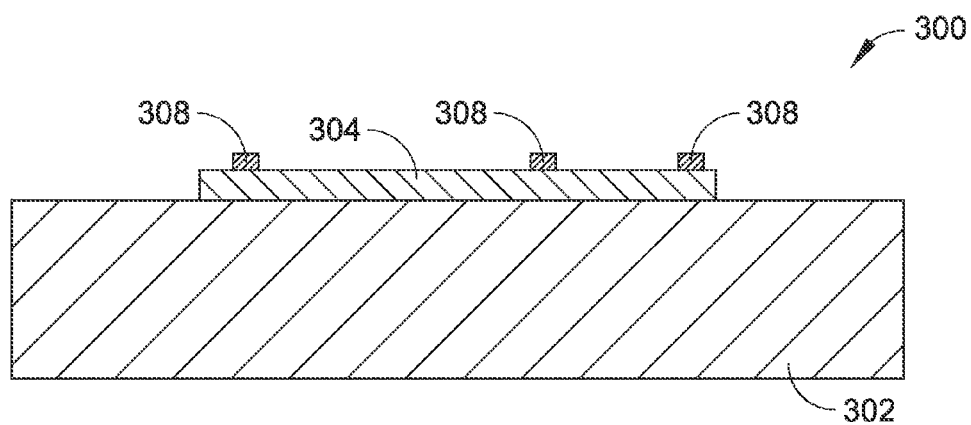
FIG. 3B is a diagrammatic partial cross-sectional side elevation view illustrating the fabrication of a wafer-level package device, such as the device shown in FIG. 1, in accordance with the process shown in FIG. 2.

A thin integrated circuit chip is then placed on the active device wafer (Block 204). FIG. 3B illustrates placing the thin integrated circuit chip 304, where the thin integrated circuit chip 304 includes an integrated circuit chip measuring approximately equal to or less than 50 μm, on the wafer 302. In some embodiments, the thin integrated circuit chip 302 includes pillars 308 or other electrical interconnections (e.g., contact pads, through-silicon vias, etc.) configured to function as an interconnection to another structure or device (e.g., a redistribution layer structure 310). The thin integrated circuit chip 304 may be placed on the wafer 302 using various methods and techniques. In some implementations, the thin integrated circuit chip 304 may be placed on the wafer 302 using flip chip technology and solder bumps 312 or wire leads. Attaching or placing the thin integrated circuit chip 304 on the wafer 302 may include interconnecting the wafer 302 with bonding pads, for example. Placing or mounting the thin integrated circuit chip 304 to circuitry (e.g, a circuit board, the wafer 302, etc.) may include flipping the thin integrated circuit chip 304 (e.g., a flip chip) so that a side with electrical connections faces down, and the thin integrated circuit chip 304 may be aligned so that its electrical connection pads align with matching pads on the wafer 302. A subsequent reflow process may be used to melt and secure the solder bumps 312 to bump interfaces.

In other implementations, the thin integrated circuit chip 304 may be attached using die attach technology employing an adhesive, such as polyimide, epoxy, or silver-filled glass. In these implementations, the adhesive may be dispensed in a controlled amount on the wafer 302, and the thin integrated circuit chip 304 may be then attached to the wafer 302. Additionally, the pillar(s) 308 or other electrical interconnections (e.g., through-silicon vias, wires, metal, etc.) and passivation layers included as a portion of the thin integrated circuit chip 304 may be formed on the thin integrated circuit chip 304 using lithography, deposition, etching, and/or electroplating processes. In some embodiments, placing the thin integrated circuit chip 304 may include placing the thin integrated circuit chip 304 on the wafer 302 utilizing pick-and-place technology. Pick-and-place technology may include using automated machines to place surface-mount devices (e.g., the thin integrated circuit chip 304) onto a substrate (e.g., the wafer 302).

Figure 3C:
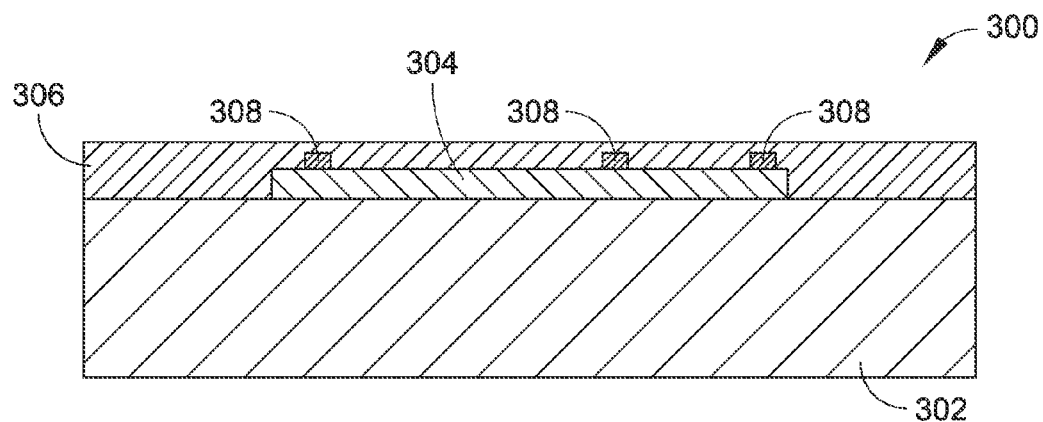
FIG. 3C is a diagrammatic partial cross-sectional side elevation view illustrating the fabrication of a wafer-level package device, such as the device shown in FIG. 1, in accordance with the process shown in FIG. 2.

Next, an encapsulation structure is formed over the thin integrated circuit chip and active device wafer to at least substantially encapsulate the thin integrated circuit chip (Block 206). FIG. 3C illustrates forming the encapsulation structure 306 over the thin integrated circuit chip 304 and wafer 302 to function as structural support and electrical insulation to the thin integrated circuit chip 304 and/or corresponding interconnection (e.g., pillars 308). In implementations, a suitable compound (e.g., epoxy, polymers, etc.) may be deposited on the wafer 302 and the thin integrated circuit chip 304 to form the encapsulation structure 306. In a specific implementation, forming an encapsulation structure 306 over the thin integrated circuit chip 304, the wafer 302, and the pillars 308 includes spin coating a polyimide or a polybenzoxazole (PBO) based material on the thin integrated circuit chip 304, the wafer 302, and the pillars 308. In spin coating, an excess amount of a solution (e.g., mold material used to form the encapsulation structure 306) is placed on the surface of the wafer 302 and the integrated circuit chip 304, which is then rotated at high speed in order to spread the fluid by centrifugal force. Rotation is continued until a desired thickness of the solution and resulting encapsulation structure 306 is achieved. Other processes for forming an encapsulation structure 306 may be utilized (e.g. molding techniques, other deposition techniques).

Figure 3D:
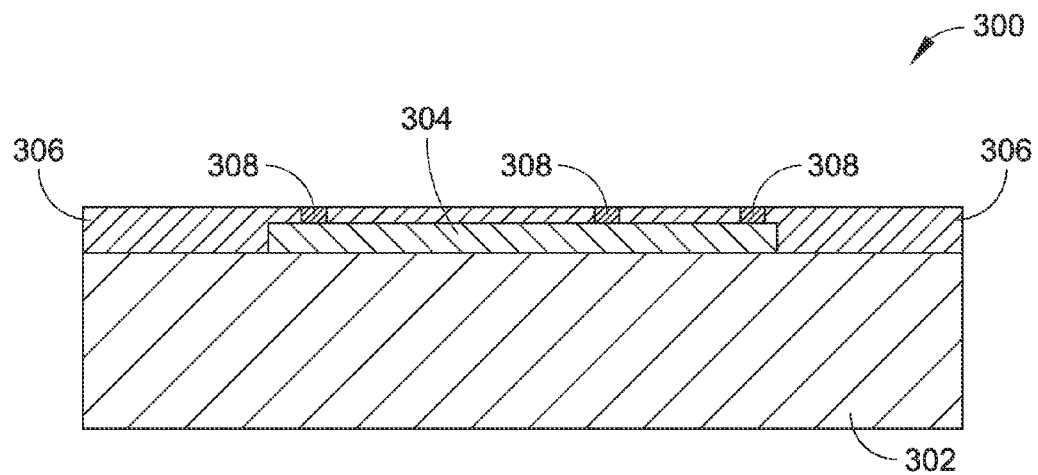
FIG. 3D is a diagrammatic partial cross-sectional side elevation view illustrating the fabrication of a wafer-level package device, such as the device shown in FIG. 1, in accordance with the process shown in FIG. 2.

Once the encapsulation structure is formed, the electrical interconnections are exposed (Block 208). FIG. 3D illustrates a portion of the encapsulation structure 306 removed so that the electrical interconnections (e.g., pillars 308, through silicon vias, etc.) are exposed. In implementations, exposing the electrical interconnections may include using grinding (e.g., facegrinding), lapping, polishing, and/or chemical-mechanical planarization processes to remove a portion of the encapsulation structure 306. In one embodiment, exposing the electrical interconnections includes using a chemical-mechanical planarization process where a chemical slurry and a polishing pad removes a desired amount of the encapsulation structure 306. In another implementation, exposing the electrical interconnections includes using a lapping and polishing process to remove a portion of a local encapsulation structure 306. In this implementation, lapping and polishing is beneficial due to the precision and control with which material (e.g., a portion of the encapsulation structure 306) can be removed. It is noted that either lapping or polishing may be utilized individually. In another implementation, exposing the electrical interconnections includes utilizing a grinding process to remove a desired portion of the encapsulation structure 306. Additionally, processes for exposing the electrical interconnections may include a process that locally (e.g., only a portion of the wafer-level package device) removes the encapsulation structure and/or a process that removes a larger portion (e.g., across the entire wafer-level package device) of the encapsulation structure 306.

Figure 3E:
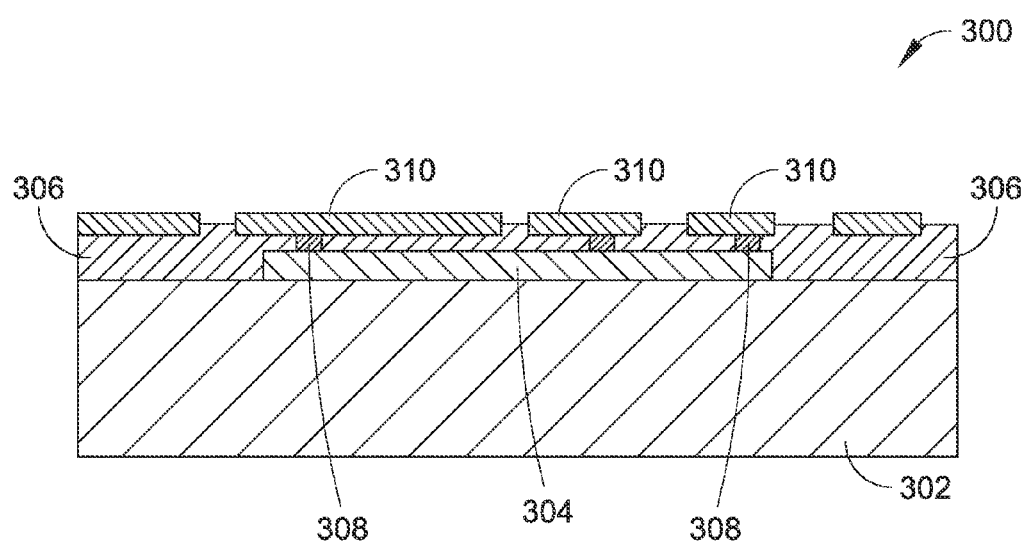
FIG. 3E is a diagrammatic partial cross-sectional side elevation view illustrating the fabrication of a wafer-level package device, such as the device shown in FIG. 1, in accordance with the process shown in FIG. 2.
Figure 3F:
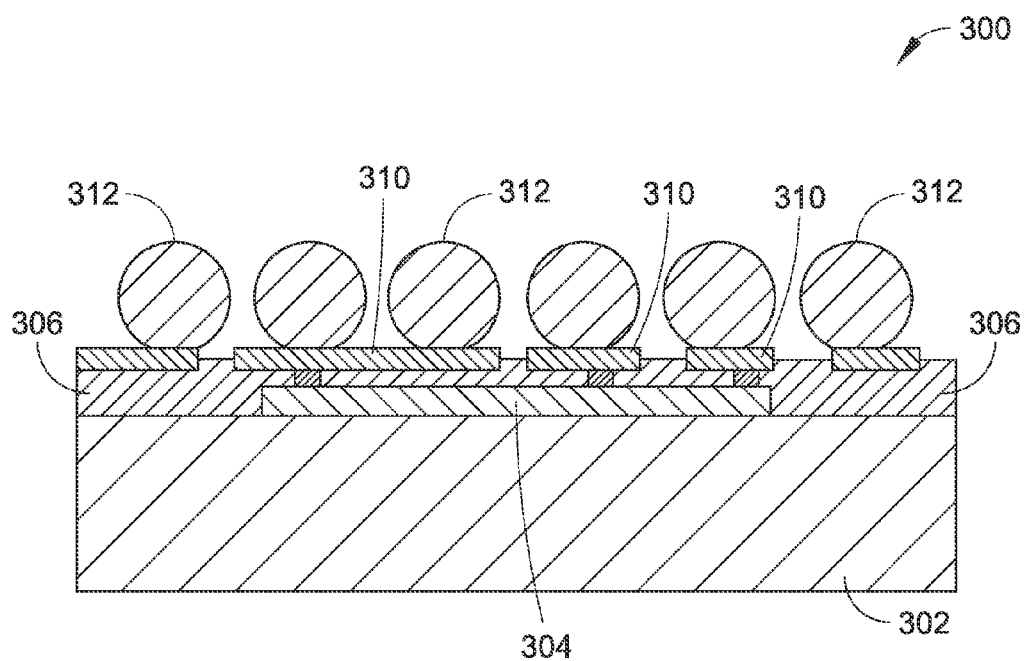
FIG. 3F is a diagrammatic partial cross-sectional side elevation view illustrating the fabrication of a wafer-level package device, such as the device shown in FIG. 1, in accordance with the process shown in FIG. 2.

A redistribution layer structure is formed on the encapsulation structure and exposed electrical interconnection (Block 210). FIG. 3E illustrates a portion of the encapsulation structure 306 with a redistribution layer structure 310 formed on and coupled to the electrical interconnections (e.g., pillars 308, through-silicon vias). Forming the redistribution layer structure 310 may include forming a redistribution layer as well as forming corresponding bonding pads, underbump metallization (UBM), through-silicon vias (TSVs), wiring and/or metal layers, and other electrical interconnections and passivation layers. In implementations, forming a redistribution layer structure 310 includes forming a redistribution layer that includes an UBM and a bonding pad that is coupled to at least one pillar 308 via line metallization. In embodiments, forming the redistribution layer structure 310 may include forming a conductive material, such as polysilicon, or a metal, such as aluminum or copper, which may be applied over a passivation layer or an isolation layer.

At least one solder bump is formed on the redistribution layer structure (Block 212). The solder bumps 312 may be formed using various ways. In one implementation, the solder bumps 312 are formed using a ball drop process. It is contemplated that other techniques such as solder paste printing, evaporation, electroplating, jetting, stud bumping, and so on may be used to form the solder bumps. In one implementation, forming solder bumps 312 include applying solder paste to predetermined locations on the redistribution layer structure 310 configured to be subsequently reflowed and form the final connections between the wafer level package device and another component (e.g., printed circuit board, other integrated circuit chip, etc.). In another embodiment, at least one solid, pre-formed solder ball may be dropped using a ball drop process. In another embodiment, forming at least one solder bump on the redistribution layer structure 310 includes placing a solder ball in a liquid or molten form on a redistribution layer structure 310 (e.g., a solder tab that is included as a portion of the redistribution layer structure 310). In both of these embodiments, the solder ball may be bonded to the underlying redistribution layer structure 310 to form a solder bump 312 by heating the solder ball and the contact material.

Once the solder bumps 312 are formed, suitable processes may be employed to add additional layers and wafer-level package device components as desired and segment the wafer-level package device into individual integrated circuit chips and individual packages.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A wafer-level package device comprising:
an active device wafer;
a thin integrated circuit chip device coupled to the active device wafer, where the thin integrated circuit chip has a thickness less than 50 µm;
an encapsulation structure covering at least a portion of the active device wafer and the thin integrated circuit chip;
a redistribution layer structure coupled to the thin integrated circuit chip; and
at least one solder bump coupled to the redistribution layer structure.

2. The wafer-level package device as recited in claim 1, wherein the active device wafer includes a silicon carrier wafer having integrated circuits formed therein.

3. The wafer-level package device as recited in claim 1, wherein the thin integrated circuit chip includes an integrated circuit chip that is at least one of equal to or less than 50 µm thick.

4. The wafer-level package device as recited in claim 1, wherein the redistribution layer structure includes at least one copper pillar.

5. The wafer-level package device as recited in claim 1, wherein the encapsulation structure includes an epoxy material.

6. The wafer-level package device as recited in claim 1, wherein the encapsulation structure includes polybenzoxazole (PBO).

7. The wafer-level package device as recited in claim 1, wherein the encapsulation structure includes polyimide.

8. An electronic device comprising:
a printed circuit board; and
a wafer level-package device coupled to the printed circuit board, the wafer-level package device including
an active device wafer having a surface;
a thin integrated circuit chip device coupled to the active device wafer, where the thin integrated circuit chip has a thickness less than 50 µm;
an encapsulation structure covering at least a portion of the active device wafer and the thin integrated circuit chip;
a redistribution layer structure coupled to the thin integrated circuit chip; and
at least one solder bump coupled to the redistribution layer structure.

9. The electronic device as recited in claim 8, wherein the active device wafer includes a silicon carrier wafer.

10. The electronic device as recited in claim 8, wherein the thin integrated circuit chip includes an integrated circuit chip that is at least one of equal to or less than 50 µm thick.

11. The electronic device as recited in claim 8, wherein the at least one pillar includes at least one copper pillar.

12. The electronic device as recited in claim 8, wherein the encapsulation structure includes an epoxy overmold.

13. The electronic device as recited in claim 8, wherein the encapsulation structure includes polybenzoxazole.

14. The electronic device as recited in claim 8, wherein the encapsulation structure includes polyimide.

15. A process comprising:
   placing a thin integrated circuit chip device on a processed active device wafer, where the thin integrated circuit chip includes at least one electrical interconnection to the processed active device wafer and at least one electrical interconnection on a side of the thin integrated circuit chip opposite the processed active device wafer, and where the thin integrated circuit chip has a thickness less than 50 µm;
   forming an encapsulation structure over the active device wafer, the thin integrated circuit chip, and the at least one electrical interconnection;
   exposing a portion of the electrical interconnection;
   forming a redistribution layer structure on the encapsulation structure, where the redistribution layer is electrically coupled to the electrical interconnection; and
   forming at least one solder bump on the redistribution layer structure.

16. The process as recited in claim 15, wherein placing a thin integrated circuit chip device on a processed active device wafer includes placing a thin integrated circuit chip device on a silicon wafer.

17. The process as recited in claim 15, wherein placing a thin integrated circuit chip includes placing a thin integrated circuit chip that is less than 50 µm in thickness.

18. The process as recited in claim 15, wherein forming the encapsulation structure includes forming a polybenzoxazole layer.

19. The process as recited in claim 15, wherein forming the encapsulation structure includes forming a polyimide layer.

20. The process as recited in claim 15, wherein the redistribution layer structure includes copper.

\* \* \* \* \*